US007554838B2

(12) United States Patent
Chen

(10) Patent No.: US 7,554,838 B2
(45) Date of Patent: Jun. 30, 2009

(54) SIMULATING CIRCUIT FOR MAGNETIC TUNNEL JUNCTION DEVICE

(75) Inventor: Yung-Hsiang Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 760 days.

(21) Appl. No.: 11/325,627

(22) Filed: Jan. 5, 2006

(65) Prior Publication Data

US 2007/0064475 A1    Mar. 22, 2007

(30) Foreign Application Priority Data

Sep. 21, 2005    (TW) ............................... 94132731 A

(51) Int. Cl.
*G11C 11/14*    (2006.01)
(52) U.S. Cl. ...................... 365/171; 365/173
(58) Field of Classification Search ................. 365/171, 365/173, 158
See application file for complete search history.

(56) References Cited

U.S. PATENT DOCUMENTS

| | | | | |
|---|---|---|---|---|
| 6,930,915 B2* | 8/2005 | Lammers et al. | ............ | 365/171 |
| 6,956,763 B2* | 10/2005 | Akerman et al. | ............ | 365/158 |
| 7,023,725 B2* | 4/2006 | Saito et al. | .................. | 365/158 |
| 7,154,771 B2* | 12/2006 | Braun | ........................ | 365/158 |
| 7,164,598 B2* | 1/2007 | Jeong et al. | .................. | 365/158 |
| 7,372,722 B2* | 5/2008 | Jeong et al. | .................. | 365/158 |
| 7,411,815 B2* | 8/2008 | Gogl | ........................... | 365/158 |
| 7,483,291 B2* | 1/2009 | Saito et al. | .................. | 365/158 |

OTHER PUBLICATIONS

Cho et al., A CMOS Macro-Madel for MTJ Resistor of MRAM Cell, 2004, phys. Stat. Sol. (a) 201, No. 8, pp. 1653-1657/DOI 10,1002/pssa.200304613.
Kim et al, Maro Model and Sense Amplifier for a MRAM, Dec. 2002, Journal of the Korean Physical Society, vol. 41, No. 6, pp. 896-901.

* cited by examiner

*Primary Examiner*—Tuan T Nguyen
*Assistant Examiner*—Hien N Nguyen
(74) *Attorney, Agent, or Firm*—Rabin & Berdo, P.C.

(57) ABSTRACT

A simulating circuit for simulating the operation of a magnetic tunnel junction (MTJ) device having at least a free layer and a fixed layer is provided. The simulating circuit includes a closed switch loop for simulating the magnetization of the free layer and the fixed layer, thus for simulating the data recording, wherein the magnetization includes parallel state or anti-parallel state; a first write loop for simulating the first quadrant of the operation region of the MTJ device; a second write loop, a third write loop, and a fourth write loop for simulating the second quadrant, the third quadrant, and the fourth quadrant of the operation regions, respectively; a first resistor for simulating the wire resistance of the bit lines; a second resistor for simulating the wire resistance of the write word lines; and a third resistor for simulating the resistance of the magnetic MTJ device.

15 Claims, 10 Drawing Sheets

SIMULATING CIRCUIT FOR MAGNETIC TUNNEL JUNCTION DEVICE

CROSS-REFERENCE TO RELATED APPLICATIONS

This non-provisional application claims priority under 35 U.S.C. § 119(a) on patent application Ser. No(s). 94132731 filed in Taiwan, R.O.C. on Sep. 21, 2005 the entire contents of which are hereby incorporated by reference.

BACKGROUND OF THE INVENTION

1. Field of the Invention

The present invention relates to a simulating circuit, and more particularly to a circuit model for simulating the write and read actions of the magnetic tunnel junction (MTJ) device.

2. Related Art

Magnetic Random Access Memory (MRAM) belongs to the non-volatile memory, which stores and records information by utilizing the resistance property, with the advantages of non-volatile, high intensity, high read and write speed, anti-radiation, etc. When writing data, the common method employs two current lines: bit line and write word line, wherein a memory unit selected by the intersection of the induction magnetic fields of the bit line and the write word line has its resistance changed by changing the magnetic direction of the magnetic material for the memory layer. When MRAM is reading the memory data, the current flow is provided to the selected magnetic memory unit, and the resistance of the unit is read to determine the digital value of the data.

The main memory unit of MRAM is the magnetic memory device made between the bit line and write word line, with a stack structure of multiple layers of magnetic metallic materials, also called Magnetic Tunnel Junction Device (MTJ), comprising a stack of a soft magnetic layer, a tunnel barrier layer, a hard magnetic layer, and a nonmagnetic conductor layer.

MTJ device determines the memory state to be "1" or "0", according to the parallel or anti-parallel state in the magnetic direction of the two layers of magnetic materials (i.e., a free layer and a fixed layer) adjacent to the tunnel barrier layer. The write data is selected by the intersection of the bit line and write word line, and the magnetic direction of the magnetic material for the memory layer is changed by the magnetic field generated by the current flowing through the write word line and the bit line, and thus the resistance thereof is changed. The write action is as set forth by the Stoner-Wolhfarth equation:

$$H_X^{2/3} + H_Y^{2/3} = H_K^{2/3}.$$

When designing the simulating circuit for the MTJ device, it should be taken into account that when the data of the MTJ device is read out, the magneto-resistive (MR) ratio (MR %) of the MTJ device will decrease as the read bias increases. However, from the already disclosed prior art so far, no circuit model has been proposed for accurately simulating the write/read actions of the MTJ device.

In addition, the write of the MTJ device all depends on the magnetic field generated by the current, thus another issue to be considered is that when designing the circuit of the current source, the wire resistances of the write word line and bit line assigned to each MTJ device should be accounted. Particularly, when the memory array is enlarged, the load of the wires is significant, which may reduce the capacity of the current source to output current.

From the already disclosed prior art, no circuit model has been disclosed for accurately simulating the write/read actions of the MTJ device. As the development of the manufacturing process, MRAM has gradually approached the stage of being practical, thus a circuit model for accurately describing the write/read actions of the MTJ device is demanded for designing MRAM circuits.

SUMMARY OF THE INVENTION

In view of this, a circuit model for accurately simulating the write/read actions of the Magnetic Tunnel Junction (MTJ) Device is disclosed, which is applied for designing MRAM circuits.

The simulating circuit for the MTJ device disclosed in the embodiments of the present invention is used for simulating the MTJ device having at least a free layer and a fixed layer, wherein the MTJ device is connected to a bit line and comprises a write word line; and the simulated circuit comprises: a closed switch loop for simulating the magnetization of the free layer and the fixed layer, to record the stored data, the magnetization being parallel or anti-parallel; a first write loop for simulating a first quadrant of operation region of the MTJ device; a second simulating circuit connected to the closed switch loop for simulating a second quadrant of operation region; a third write loop for simulating a third quadrant of operation region; a fourth write loop for simulating a fourth quadrant of operation region; a first resistor for simulating the wire resistance of the bit line; a second resistor for simulating the wire resistance of the write word line; and a third resistor for simulating the resistance of the MTJ device.

The circuit model for the MTJ device disclosed in the embodiments of the present invention can be applied for the circuit designing to simulate the write and read actions of the MTJ device. The model can describe the write action of the asteroid curve in the overall operation region of the MTJ device. After writing, the resistance of the MTJ device is automatically switched and memorized according to the write state (parallel or anti-parallel), and the effect of the Bias dependent MR Ratio (MR %) i.e., the MR ratio reduces as the read bias increases, can be simulated.

In the circuit model for the MTJ device disclosed in the embodiments of the present invention, the parameters of the manufacturing process, such as the wire resistance of bit line and write word line, and the size of the magnetic field generated by the current are all included and can be adjusted.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other objects, features and other advantages of the invention will be more clearly understood from the following detailed description when taken in conjunction with the accompanying drawings, in which.

DETAILED DESCRIPTION OF THE INVENTION

Figure 1:
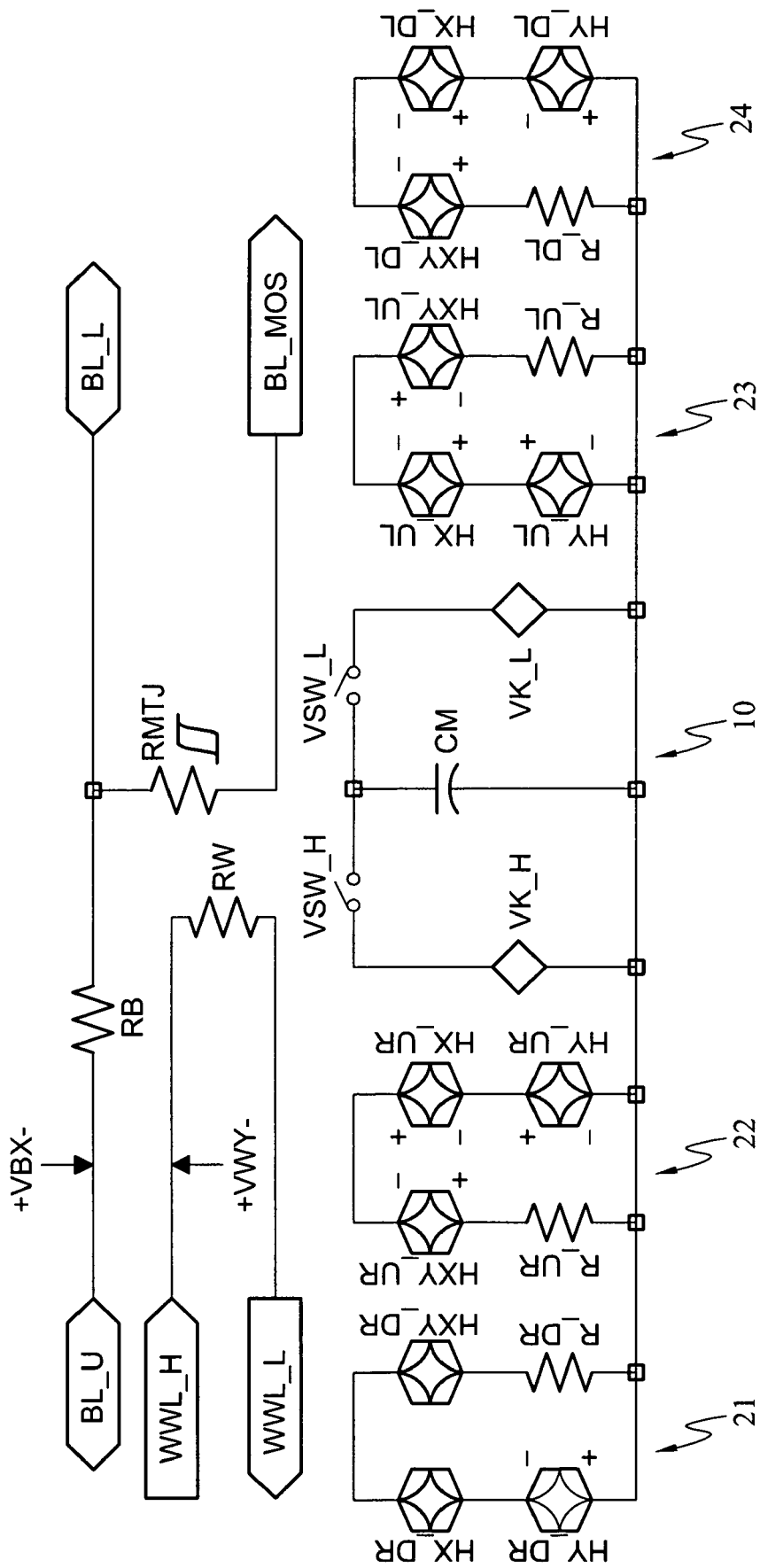
FIG. 1 shows a circuit model for simulating the magnetic tunnel junction (MTJ) device according to the present invention.

Reference will now be made in greater detail to a preferred embodiment of the invention, an example of which is illustrated in the accompanying drawings. Wherever possible, the same reference numerals are used throughout the drawings and the description to refer to the same or like parts. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Referring to FIG. 1, which is a simulating circuit for the Magnetic Tunnel Junction Device, shows the equivalent circuits for writing in the four operation regions of the MTJ device.

As for the magnetic memory, data (0 or 1) is recorded by the magnetization (parallel or anti-parallel) of the free layer and the fixed layer. In the embodiment, the simulation is conducted by a closed switch loop 10, to simulate the recording state by recording the write data into the storage capacitor CM. The hysteresis curve of the free layer is determined by the terminal voltages of the voltage control switches VSM_H and VSM_L, and the simulated resistors R_UR, R_DR, R_UL, and R_DL of the four operation regions. The closed switch loop 10 further includes a first equivalent voltage source VK_H to indicate the state "1" and an equivalent voltage source VK_L to indicate a second state "0", wherein the absolute value of the equivalent voltage sources VK_H and VK_L equals to the equivalent voltage VK of the coercive field. The positive voltage terminal of the first equivalent voltage source VK_H indicating the state "1" is connected to the voltage control switch VSW_H, whereas the negative voltage terminal is connected to the storage capacitor CM; and the negative voltage terminal of the second equivalent voltage source VK_L indicating the state "0" is connected to the voltage control switch VSW_L, whereas the positive voltage terminal is connected to the storage capacitor CM.

The four operation regions of the MTJ device are simulated by a first write loop 21, a second write loop 22, a third write loop 23, and a fourth write loop 24 respectively; wherein each write loop consists of three controlled voltage sources and a simulated resistor.

A first write loop 21 of the first quadrant of operation region for simulating MTJ device includes a first controlled voltage source HY_UR, a second controlled voltage source HX_UR, a third controlled voltage source HXY_UR, and a simulated resistor R_UR. The first controlled voltage source HY_UR indicates the equivalent write voltage generated by the write word line current, e.g., a current-controlled voltage source. The second controlled voltage source $HX_{13}$ UR indicates the equivalent write voltage generated by the bit line current, e.g., a current-controlled voltage source. The third controlled voltage source HXY_UR indicates the equivalent write voltage determined by the bit line current and the write word line current in the approximation equation, e.g., a current controlled voltage source. The positive voltage terminal of the first controlled voltage source HY_UR is connected to the negative voltage terminal of the second controlled voltage source HX_UR. The positive voltage terminal of the second controlled voltage source HX_UR is connected to the negative voltage terminal of the third controlled voltage source HXY_UR. The positive voltage terminal of the third controlled voltage source $HXY_{13}$ UR is connected to one end of the simulated resistor R_UR, and the other end of the simulated resistor R_DR is connected to the negative voltage terminal of the first controlled voltage source HY_UR.

The second write loop 22 of the second quadrant of operation region for simulating the MTJ device includes a fourth controlled voltage source HY_UL, a fifth controlled voltage source HX_UL, a sixth controlled voltage source HXY_UL, and a simulating resistor $R_{13}$ UL. The fourth controlled voltage source HY_UL indicates the equivalent write voltage generated by the write word line current, e.g., a current-controlled voltage source. The fifth controlled voltage source HX_UL indicates the equivalent write voltage generated by the bit line current, e.g., a current-controlled voltage source. The sixth controlled voltage source HXY_UL indicates the equivalent write voltage determined by the bit line current and the write word line current in the approximation equation, e.g., a current-controlled voltage source. The positive voltage terminal of the fourth controlled voltage source HY_UL is connected to the positive voltage terminal of the fifth controlled voltage source HX_UL. The negative voltage terminal of the fifth controlled voltage source HX_UL is connected to the positive voltage terminal of the sixth controlled voltage source HXY_UL. The negative voltage terminal of the sixth controlled voltage source HXY_UL is connected to one end of the simulating resistor R_UL, and the other end of the simulating resistor R_UL is connected to the negative voltage terminal of the fourth controlled voltage source HY_UL.

The third simulating circuit 23 of the third quadrant of operation region for simulating the MTJ device includes a seventh controlled voltage source HY_DL, an eighth controlled voltage source HX_DL, a ninth controlled voltage source HXY_DL, and a simulating resistor R_DL. The seventh controlled voltage source HY_DL indicates an equivalent write voltage generated by the write word line current, e.g., a current-controlled voltage source. The eighth controlled voltage source HX_DL indicates an equivalent write voltage generated by the bit line current, e.g., a current-controlled voltage source. The ninth controlled voltage source HXY_DL indicates an equivalent write voltage determined by the bit line current and the write word line current in the approximation equation, e.g., a current-controlled voltage source. The negative voltage terminal of the seventh controlled voltage source HY_DL is connected to the positive voltage terminal of the eighth controlled voltage source HX_DL. The negative voltage terminal of the eighth controlled voltage source HX_DL is connected to the negative voltage terminal of the ninth controlled voltage source HXY_DL. The positive voltage terminal of the ninth controlled voltage source HXY_DL is connected to one end of the simulating resistor R_DL, and the other end of the simulating resistor R_DL is connected to the positive voltage terminal of the seventh controlled voltage source HY_DL.

The fourth write loop 24 of the fourth quadrant of operation region for simulating the MTJ device includes a tenth controlled voltage source HY_DR, an eleventh controlled voltage source HX_DR, a twelfth controlled voltage source HXY_DR, and a simulating resistor R_DR. The tenth controlled voltage source HY_DR indicates an equivalent write voltage generated by the write bit line current, e.g., a current-controlled voltage source. The eleventh controlled voltage source HX_DR indicates an equivalent write voltage generated by the bit line current, e.g., a current-controlled voltage source. The twelfth controlled voltage source HXY_DR indicates an equivalent write voltage determined by the bit line current and the write word line current in the approximation equation, e.g., a current-controlled voltage source. The negative voltage terminal of the tenth controlled voltage source HY_DR is connected to the negative voltage terminal of the eleventh controlled voltage source HX_DR. The positive voltage terminal of the eleventh controlled voltage source HX_DR is connected to the positive voltage terminal of the twelfth controlled voltage source HXY_DR. The negative voltage terminal of the twelfth controlled voltage source HXY_DR is connected to one end of the simulating resistor R_DR, and the other end of the simulating resistor R_DR is connected to the positive voltage terminal of the tenth controlled voltage source HY_DR.

In the simulating circuit of FIG. 1, the wire resistance of the word line of the MTJ device is simulated by a first resistor RB, and the wire resistance of the write bit line is simulated by a second resistor RW. The resistance of the MTJ device is simulated by a third resistor RMTJ. The resistance of the third resistor of the resistors for simulating the MTJ device is set according to an approximation equation, and it is automatically adjusted by the voltage of the storage capacitor of the closed switch loop.

The above simulating circuit is carried out by HSPICE software, and the equivalent write voltages generated by the bit line current of the four operation regions of the MTJ device can be controlled by the current of zero voltage source VBX. The equivalent write voltages generated by the write bit line current of the four operation regions can be controlled by the current of the zero voltage source VWY. The current-controlled voltage sources HXY_DR, HXY_UR, HXY_UL, and HXY_DL indicate the equivalent write voltages determined by the write bit line current and word line current in the four operation regions in approximation equation respectively.

The operation of the simulating circuit in FIG. 1 is illustrated below.

For writing, a linear equation is proposed in the present invention, $H_X+H_Y+cH_XH_Y=V_K$, for fitting the non-linear Stoner-Wolhfarth equation, wherein a write circuit which can describe the operations in the overall region is constituted by the linear controlled current/voltage devices, and the write data is recorded in the storage capacitor through the closed switch loop. For reading the resistance, the I-V property of the MTJ device is indicated by the Simmon's equation $I_{MTJ}=A_{MTJ}\times[\theta\cdot(1+\gamma V_{MTJ}^2)]\times V_{MTJ}$, wherein $A_{MTJ}$ is the area of the MTJ device, and $\theta$ is RA-related, and $\gamma$ determines the effect of Bias dependent MR Ratio (MR %), i.e., MR ratio reduces as the read bias increases.

Figure 2:
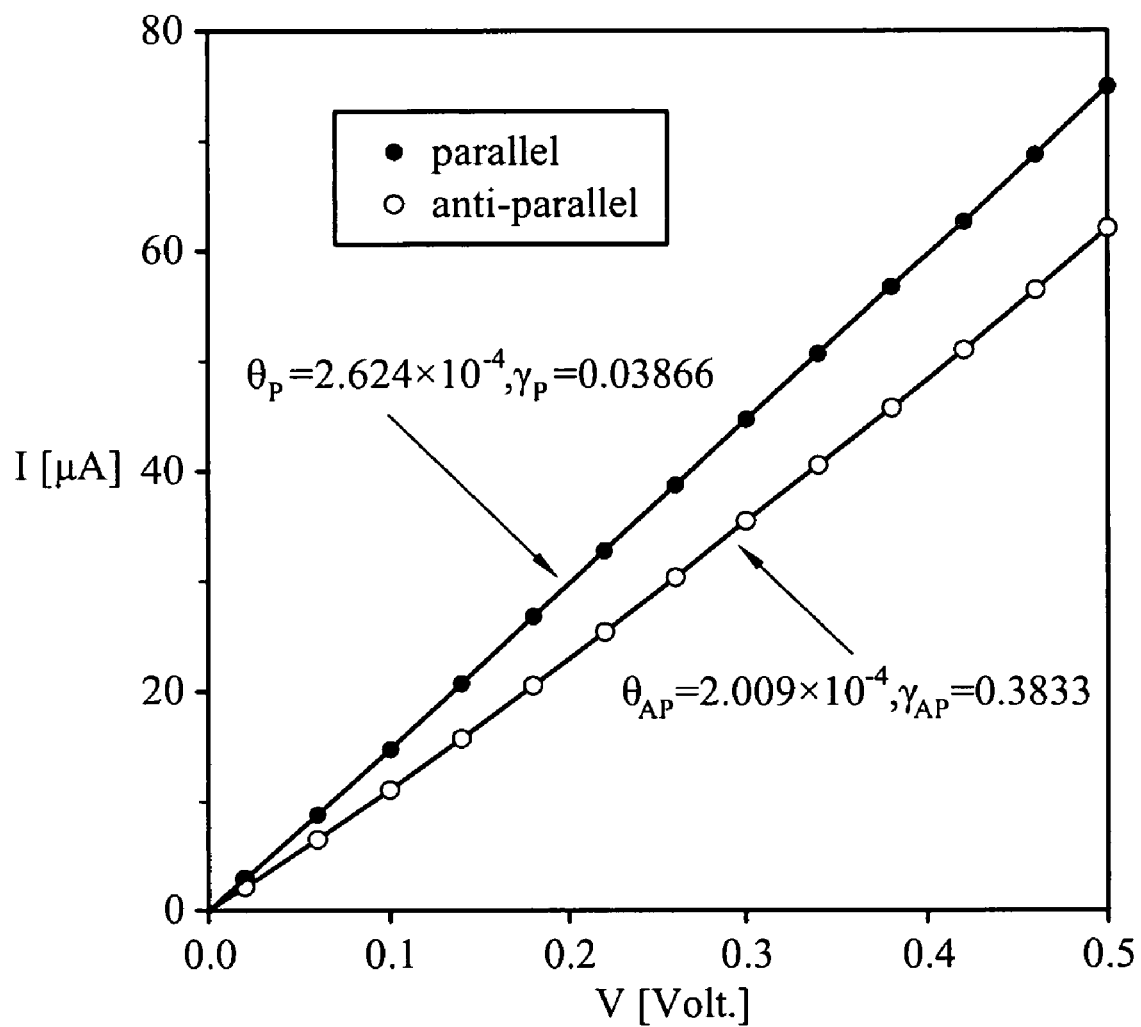
FIG. 2 shows a fitting result of the measured I-V property of the oval MTJ device with an area of $1.2 \times 0.6$ μm$^2$ with the Simmon's equation.

Two set of parameters $(\theta_P, \gamma_P)$ and $(\theta_{AP}, \gamma_{AP})$ can be obtained from the I-V properties of the parallel and anti-parallel states of the MTJ device. FIG. 2 is the result of the I-V property of the oval MTJ device with an approximated area of $1.2\times0.6$ um$^2$ by the Simmon's equation. The effect of Bias dependent MR Ratio (MR %), i.e., MR ratio reduces as the read bias increases, must be added in the model of the device.

The parameters $\theta$ and $\gamma$ are linearly adjusted by the voltage of the storage capacitor, with the value between $(\theta_{AP}\sim\theta_P)$ and $(\gamma_{AP}\sim\gamma_P)$, which can be written as:

$$\theta = \frac{(\theta_P+\theta_{AP})}{2} - \frac{(\theta_P-\theta_{AP})}{2}\left(\frac{V_{CM}}{V_K}\right),$$

$$\gamma = \frac{(\gamma_{AP}+\gamma_P)}{2} - \frac{(\gamma_P-\gamma_{AP})}{2}\left(\frac{V_{CM}}{V_K}\right).$$

When writing data "1", the voltage control switch VSW_H is turned on, and the storage capacitor CM is charged to a positive equivalent coercivity voltage VK; when writing data "0", the voltage control switch VSW_L is turned on, and the storage capacitor CM is charged to a negative equivalent coercivity voltage –VK.

Figure 3:
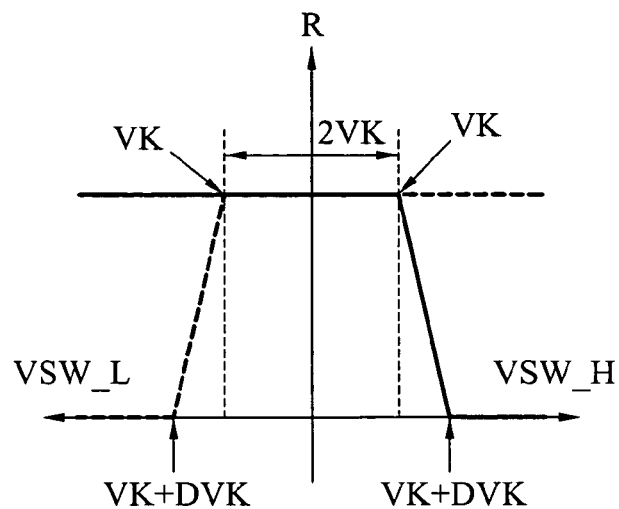
FIG. 3 shows the settings of the voltage control switch in the circuit model for simulating MTJ device according to the present invention.
Figure 4:
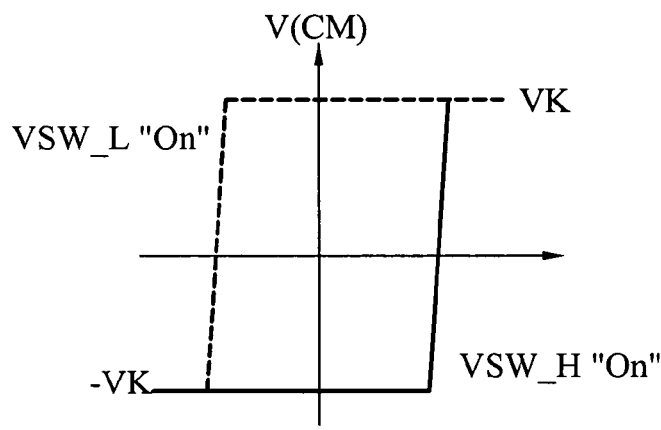
FIG. 4 shows the voltage hysteresis property of the closed switch loop of the circuit model for simulating MTJ device according to the present invention when the write data is recorded into the storage capacitor.
Figure 5:
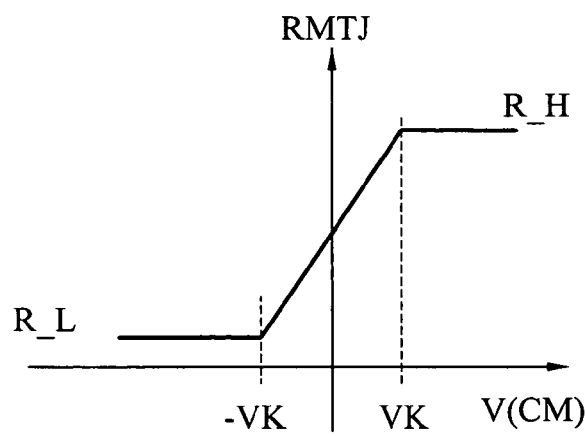
FIG. 5 shows the linear relationship between the resistance of the MTJ device and the voltage of the storage capacitor.

Refer to FIG. 3 for the settings of the voltage control switch VSM_H and VSW_L; refer to FIG. 4 for voltage $V_{CM}$ hysteresis property when the write data is recorded into the storage capacitor CM by the closed switch loop; and refer to FIG. 5 for the illustration of the linear relationship between the resistance $R_{MTJ}$ of the MTJ device and the voltage $V_{CM}$ of the storage capacitor.

The reason for using the linear equation $H_X+H_Y+cH_XH_Y=V_K$ to approximate the non-linear Stoner-Wolhfarth equation in the present invention is illustrated below.

Based on the Stoner-Wolhfarth model, the asteroid curve of the write magnetic field can be derived as $H_X^{2/3}+H_Y^{2/3}=H_K^{2/3}$, wherein $H_K$ is the coercive field.

Figure 6:
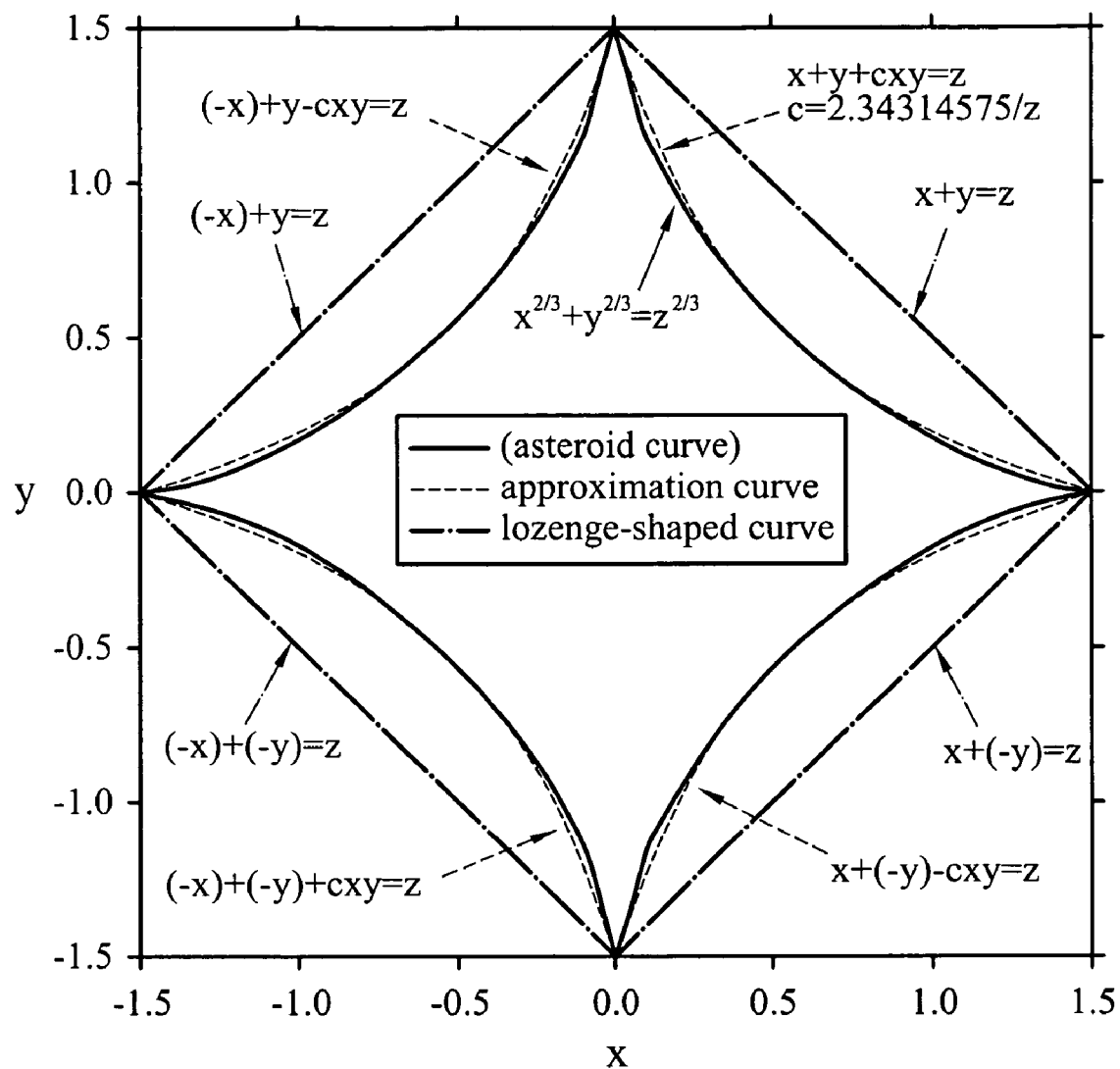
FIG. 6 shows a comparison between the Stoner-Wolhfarth asteroid curve and the approximation equation according to the present invention.

The non-linear equation cannot be used in the circuit design software HSPICE, neither can the magnetic fields. Therefore, the magnetic fields are firstly converted to the equivalent voltage used in the circuit according to the present invention, and then a linear equation $H_X+H_Y+cH_XH_Y=V_K$ is proposed for approximation, wherein the constant $c=2.3414574/V_K$. The diagram comparing the Stoner-Wolhfarth asteroid curve with the approximation equation proposed in the present invention is shown in FIG. 6. It is known from the figure that the approximation equation proposed in the present invention can be fitting to the Stoner-Wolhfarth asteroid curve; whereas high estimation of the write current simulation may be caused by employing the lozenge approximation in FIG. 6. The approximation equation according to the present invention can also be applied for asteroid curves other than the Stoner-Wolhfarth equation, wherein $c$ can be any constant suitable for fitting the curve.

Considering the center point shift of the asteroid curve caused by the interlayer coupling between the interface layers, and the stray field of the fixed layer, the resistor voltage of each write operation region can be represented as:

$$V_R=(H_X-V_{INX})+(H_Y-V_{INY})+c(H_X-V_{INX})(H_Y-V_{INY}),$$

wherein, $V_{INX}$ and $V_{INY}$ indicate the center point shifts of the asteroid curve respectively. When the magnetic field generated by the write bit line current is beyond the coercive field, the value of $H_Y$ is limited to the maximum value $V_K$ or the minimum value $-V_K$.

Figure 7:
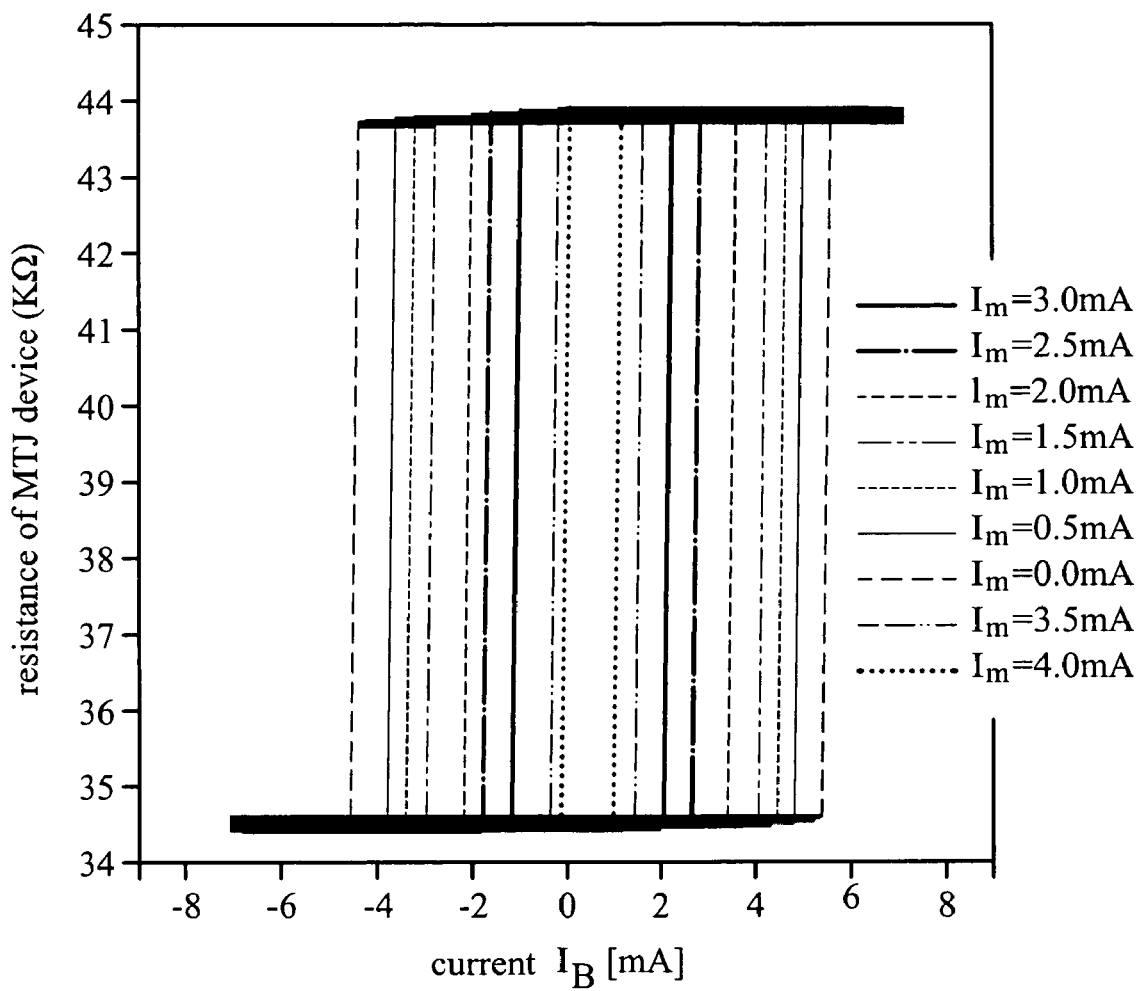
FIG. 7 shows a measured R-I loop of the MTJ device.
Figure 8:
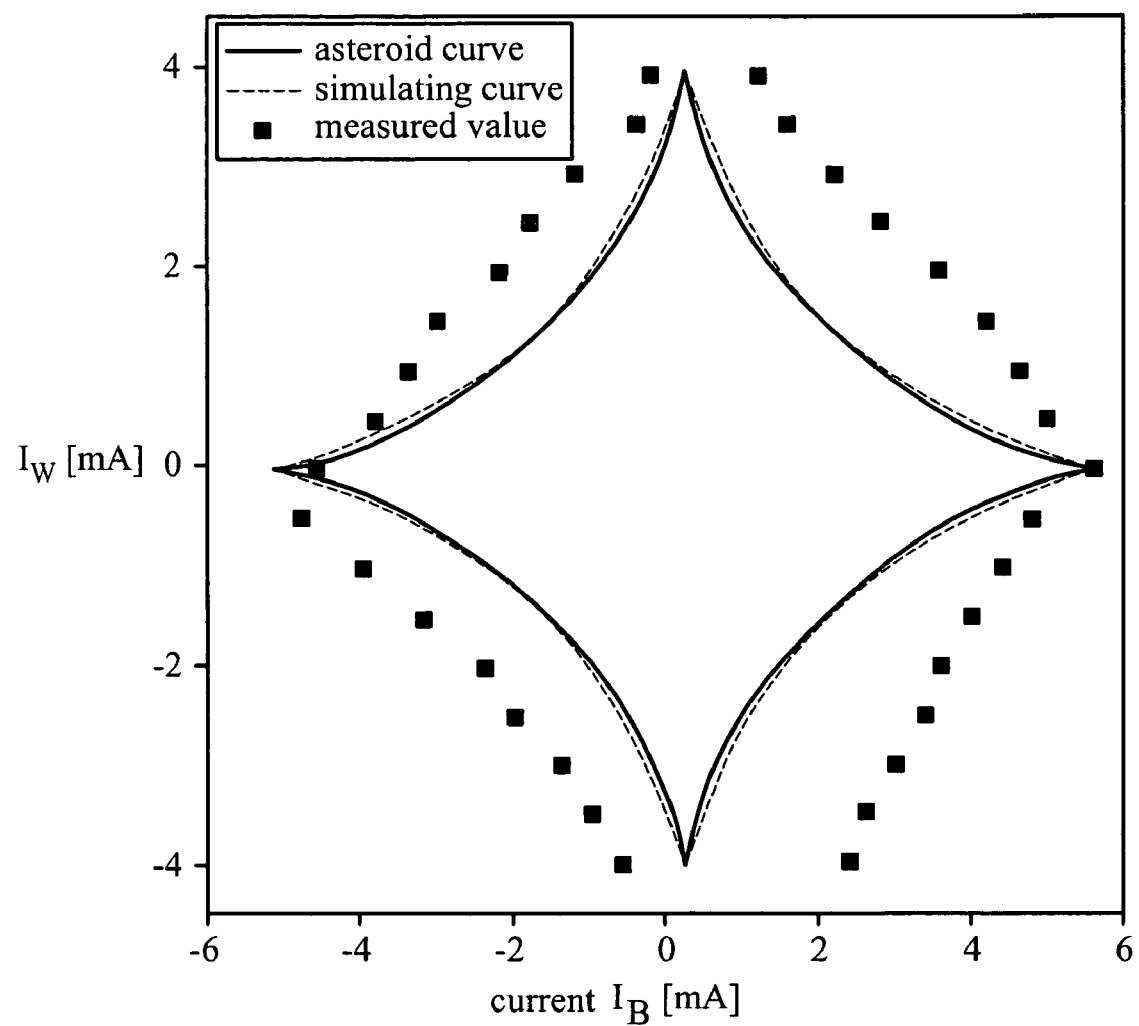
FIG. 8 shows an asteroid curve for the write current of the MTJ device.
Figure 9:
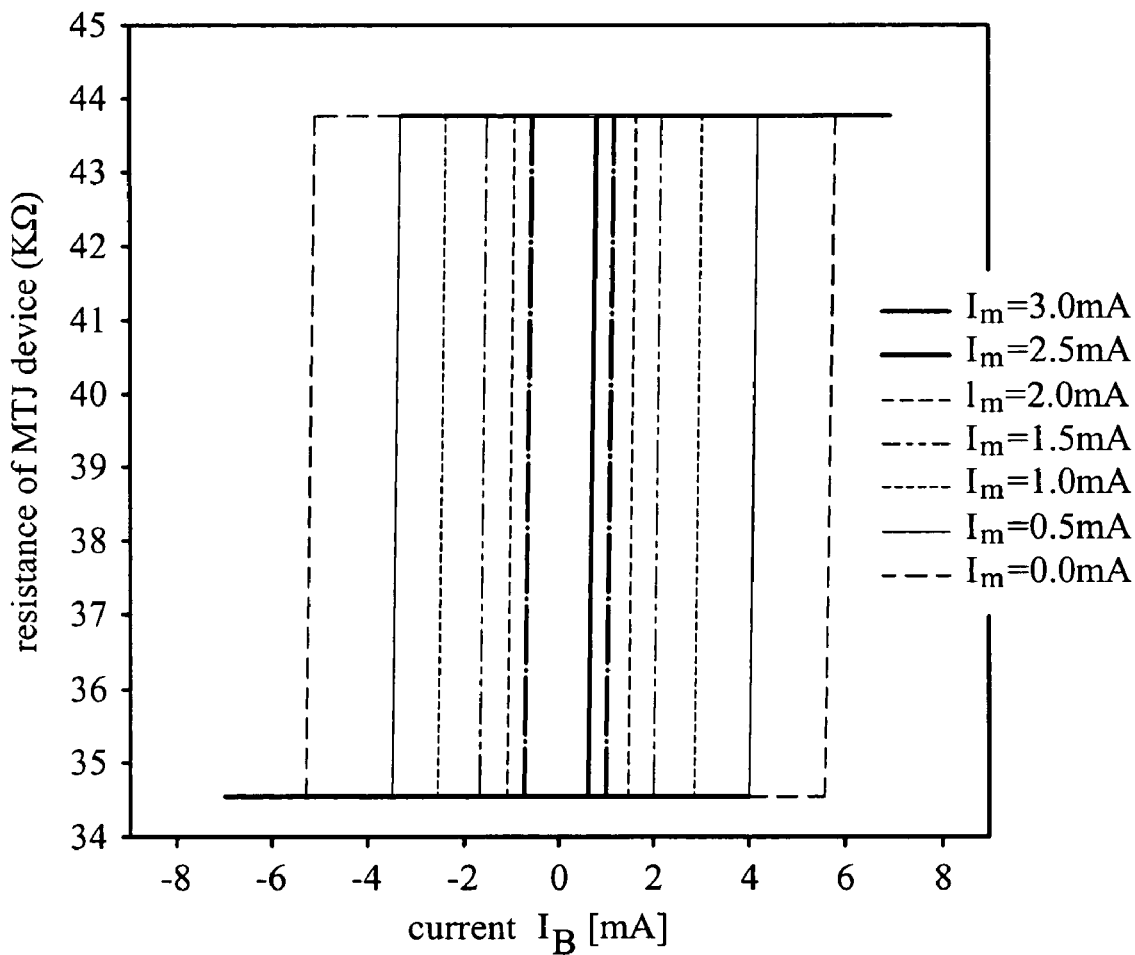
FIG. 9 shows a simulated R-I loop of the MTJ device.
Figure 10:
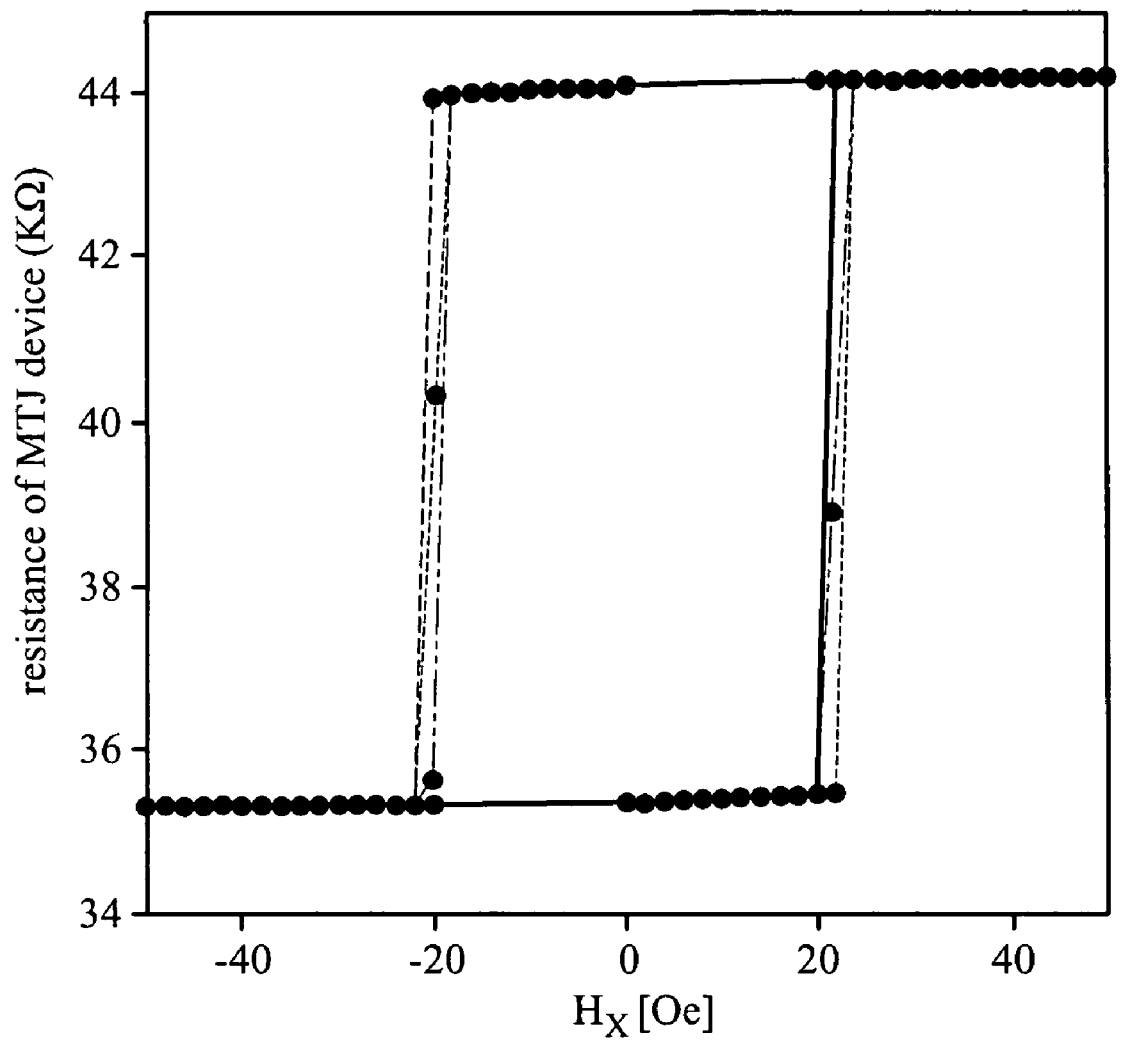
FIG. 10 shows a measured R-H loop of the MTJ device.

The R-I loop measured by the oval MTJ device with a dimension of 0.72×0.36um² is shown in FIG. 7; and the asteroid curve of the write current is shown in FIG. 8. The R-I loop simulated by the model of the present invention is shown in FIG. 9; the measured R-H loop is shown in FIG. 10. The coercive field and the center shift field derived from the R-H loop are 21.5 and 1.02 Oe respectively, and the efficiency for generating magnetic fields by the word line current and the bit line current are 5.3429 Oe/mA and 3.945 Oe/mA respectively.

Figure 11:
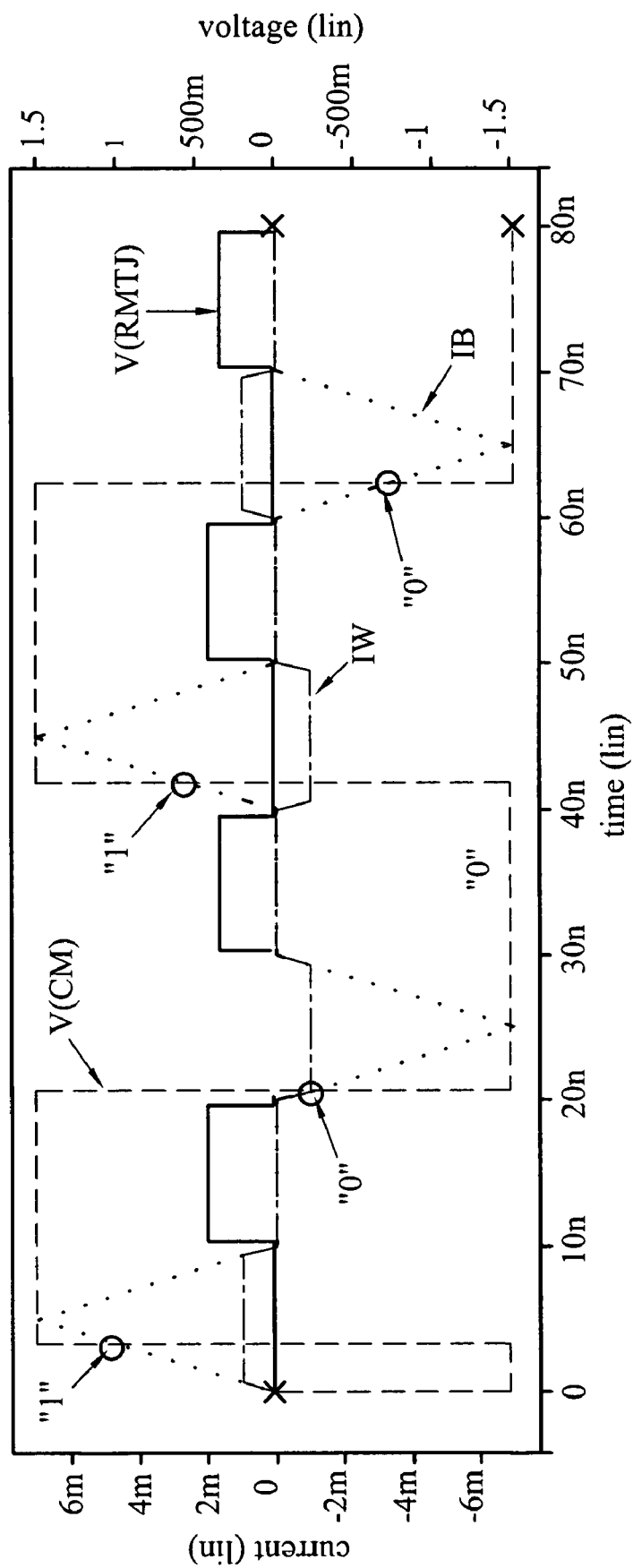
FIG. 11 shows a simulating schematic view of the write/read actions in the overall operation region of the MTJ circuit model according to the present invention.
Figure 12:
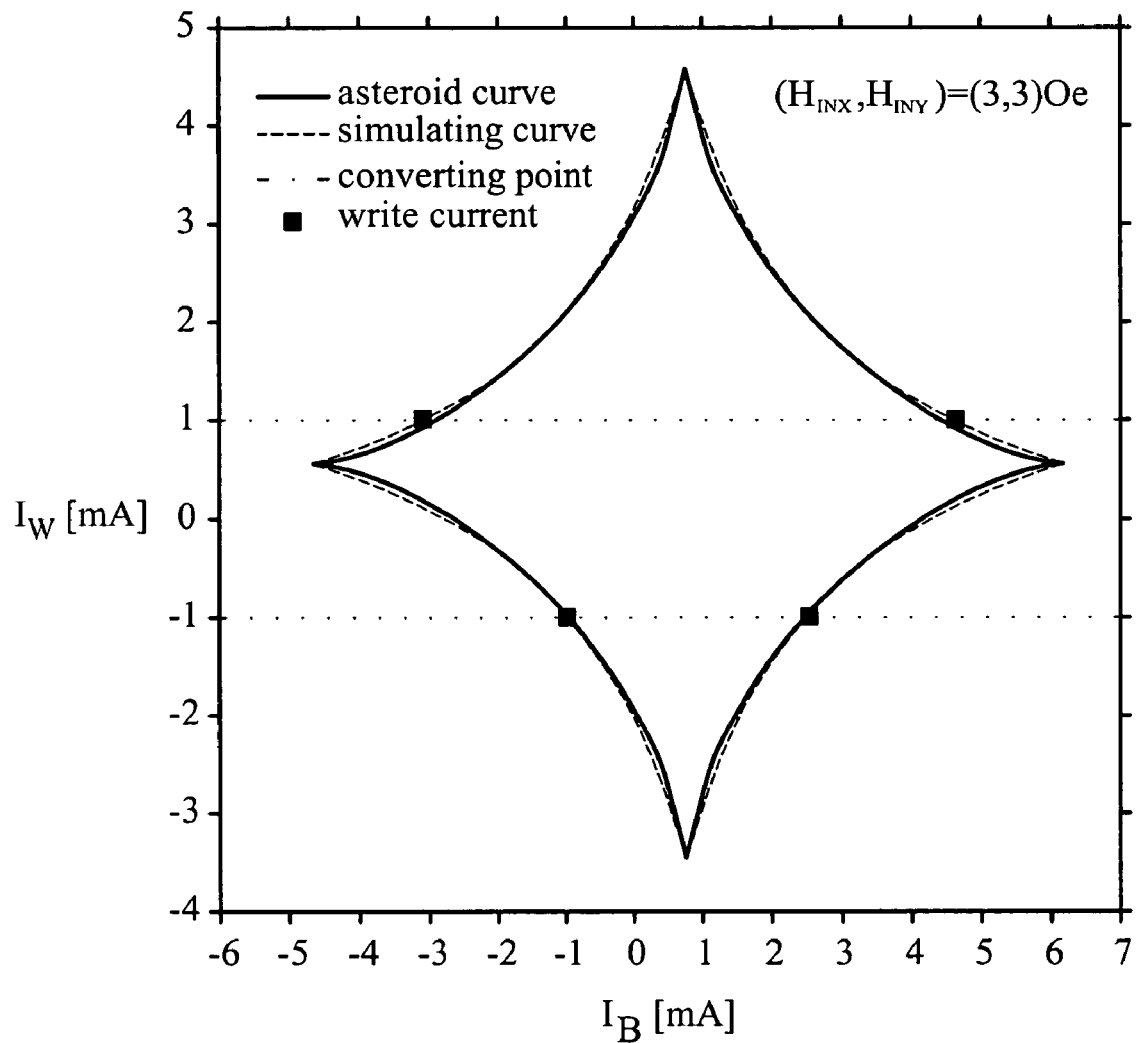
FIG. 12 shows a comparison between the MTJ data write current of each write operation region extracted from the simulating process and the approximation equation and the Stoner-Wolhfarth equation.

The write and read results for the authentification model in the overall operation region are shown in FIG. 11. The initial state for the MTJ device is data "0", and the write sequence is shown as follows: firstly, in the first quadrant, set the write current to write data "1", and read data "1"; next, in the third quadrant, set the write current to write data "0", and read data "0"; then, in the fourth quadrant, set the write current to write data "1", and read data "1"; and finally, in the second quadrant, set the write current to write data "0", and read data "0". When simulating, the center point shift for the asteroid curve of the write current is set to be $(H_{INX}, H_{INY})=(3,3)$ Oe, whereas the read current of the word line through the MTJ device is 10 uA. The MTJ data write current of each write operation region is extracted from the simulating process, and then compared with the approximation equation and Stoner-Wolhfarth equation, as shown in FIG. 12. Thus, the model disclosed in the present invention has been verified to successfully simulate the write and read actions of the MTJ device.

The circuit model for the MTJ device according to the present invention can be applied to the circuit design, and can simulate the write and read actions of the MTJ device. The model can be used to describe the write action for the asteroid curve of the MTJ device in the overall operation region. After that, the resistance of the MTJ device is automatically switched and memorized according to the written state (parallel or anti-parallel), and the effect of the Bias dependent MR Ratio, i.e., the MR ratio reduces as the read bias increases, can be simulated. In the circuit model of the MTJ device according to the present invention, the parameters of the manufacturing process, such as the wire resistance of the bit line and the word line, the size of the magnetic field generated by the current thereof are all taken into account and can be adjusted. The circuit model for the MTJ device according to the present invention is suitable for completely simulating the MRAM circuit, to enhance the current source and the designing accuracy of the sense amplifier.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A simulating circuit for a Magnetic Tunnel Junction (MTJ) device, for simulating an MTJ device having at least a free layer and a fixed layer, wherein the MTJ device is connected to a write word line and a write bit line, and the operation region of the MTJ device are divided into four quadrants, the simulating circuit comprising:
    a closed switch loop, for simulating the magnetization of the free layer and the fixed layer, to simulate the recording of data, wherein the magnetization includes the parallel or anti-parallel state;
    a first write loop, for simulating the first quadrant of the operation region of the MTJ device;
    a second write loop, for simulating the second quadrant of the operation region of the MTJ device;
    a third write loop, for simulating the third quadrant of the operation region of the MTJ device;
    a fourth write loop, for simulating the fourth quadrant of the operation region of the MTJ device;
    a first resistor, for simulating the wire resistance of the bit line;
    a second resistor, for simulating the wire resistance of the write word line; and
    a third resistor, for simulating the resistance of the MTJ device.

2. The simulating circuit for the MTJ device according to claim 1, wherein the closed switch loop comprises:
    a storage capacitor;
    a first and a second voltage control switch, connected to the storage capacitor; and
    a first equivalent voltage source and a second equivalent voltage source, wherein the first equivalent voltage source indicates the state "1", and the second equivalent voltage source indicates the state "0", wherein the positive voltage terminal of the first equivalent voltage source is connected to the first voltage control switch, and the negative voltage terminal of the first equivalent voltage source is connected to the storage capacitor; and the negative voltage terminal of the second equivalent voltage source is connected to the second voltage control switch, and the positive voltage terminal of the second equivalent voltage source is connected to the storage capacitor.

3. The simulating circuit for the MTJ device according to claim 1, wherein the first write loop comprises:
    a simulating resistor;
    a first controlled voltage source, indicating an equivalent write voltage generated by the write word line current;
    a second controlled voltage source, indicating an equivalent write voltage generated by the bit line current; and
    a third controlled voltage source, indicating an equivalent write voltage determined by the bit line current and the write word line current in the approximation equation;
    wherein, the positive voltage terminal of the first controlled voltage source is connected to the negative voltage terminal of the second controlled voltage source; the positive voltage terminal of the second controlled voltage source is connected to the negative voltage terminal of the third controlled voltage source; the positive voltage terminal of the third controlled voltage source is connected to one end of the simulating resistor, and the other end of the simulating resistor is connected to the negative voltage terminal of the first controlled voltage source.

4. The simulating circuit for the MTJ device according to claim 3, wherein the first controlled voltage source is a current-controlled voltage source; the second controlled voltage source is a current-controlled voltage source; and the third controlled voltage source is a current-controlled voltage source.

5. The simulating circuit for the MTJ device according to claim 3, wherein the equivalent write voltage generated by the write word line current for the MTJ device is controlled by a zero voltage source current; and the equivalent write voltage generated by the bit line current is controlled by a zero voltage source current.

6. The simulating circuit for the MTJ device according to claim 1, wherein the second write loop comprises:
    a simulating resistor;
    a fourth controlled voltage source, indicating an equivalent write voltage generated by the write word line current;

a fifth controlled voltage source, indicating an equivalent write voltage generated by the bit line current; and a sixth controlled voltage source, indicating an equivalent write voltage determined by a bit line current and the write word line current in the approximation equation;

wherein, the positive voltage terminal of the fourth controlled voltage source is connected to the positive voltage terminal of the fifth controlled voltage source; the negative voltage terminal of the fifth controlled voltage source is connected to the positive voltage terminal of the sixth controlled voltage source; the negative voltage terminal of the sixth controlled voltage source is connected to one end of the simulating resistor, and the other end of the simulating resistor is connected to the negative voltage terminal of the fourth controlled voltage source.

7. The simulating circuit for the MTJ device according to claim 6, wherein the fourth controlled voltage source is a current-controlled voltage source; the fifth controlled voltage source is a current-controlled voltage source; and the sixth controlled voltage source is a current-controlled voltage source.

8. The simulating circuit for the MTJ device according to the claim 6, wherein the equivalent write voltage generated by the write word line current for the MTJ device is controlled by a zero voltage source current; and the equivalent write voltage generated by the bit line current is controlled by a zero voltage source current.

9. The simulating circuit for the MTJ device according to claim 1, wherein the third write loop comprises:

a simulating resistor;

a seventh controlled voltage source, indicating an equivalent write voltage generated by the write word line current;

an eighth controlled voltage source, indicating an equivalent write voltage generated by the bit line current; and a ninth controlled voltage source, indicating an equivalent write voltage determined by the bit line current and the write word line current in the approximation equation;

wherein, the negative voltage terminal of the seventh controlled voltage source is connected to the positive voltage terminal of the eighth controlled voltage source; the negative voltage terminal of the eighth controlled voltage source is connected to the negative voltage terminal of the ninth controlled voltage source; the positive voltage terminal of the ninth controlled voltage source is connected to one end of the simulating resistor, and the other end of the simulating resistor is connected to the positive voltage source of the seventh controlled voltage source.

10. The simulating circuit for the MTJ device according to claim 9, wherein the seventh controlled voltage source is a current-controlled voltage source; the eighth controlled voltage source is a current-controlled voltage source; and the ninth controlled voltage source is a current-controlled voltage source.

11. The simulating circuit for the MTJ device according to claim 9, wherein the equivalent write voltage generated by the write word line current of the MTJ device is controlled by a zero voltage source current; and the equivalent write voltage generated by the bit line current is controlled by a zero voltage source current.

12. The simulating circuit for the MTJ device according to claim 1, wherein the fourth write loop comprises:

a simulating resistor;

a tenth controlled voltage source, indicating an equivalent write voltage generated by the write word line current;

an eleventh controlled voltage source, indicating an equivalent write voltage generated by the bit line current; and a twelfth controlled voltage source, indicating an equivalent write voltage determined by the bit line current and the write word line current in the approximation equation;

wherein, the negative voltage terminal of the tenth controlled voltage source is connected to the negative voltage terminal of the eleventh controlled voltage source; the positive voltage terminal of the eleventh controlled voltage source is connected to the positive voltage terminal of the twelfth controlled voltage source; the negative voltage terminal of the twelfth controlled voltage source is connected to one end of the simulating resistor, and the other end of the simulating resistor is connected to the positive voltage terminal of the tenth controlled voltage source.

13. The simulating circuit for the MTJ device according to claim 12, wherein the tenth controlled voltage source is a current-controlled voltage source; the eleventh controlled voltage source is a current-controlled voltage source; and the twelfth controlled voltage source is a current-controlled voltage source.

14. The simulating circuit for the MTJ device according to claim 12, wherein the equivalent write voltage generated by the write word line current of the MTJ device is controlled by a zero voltage source current; and the equivalent write voltage generated by the bit line current is controlled by a zero voltage source current.

15. The simulating circuit for the MTJ device according to claim 1, wherein the resistance of the third resistor of the resistors for the MTJ device is set according to an approximation equation, and automatically adjusted by the voltage of the storage capacitor for the closed switch loop, wherein the approximation equation is $H_X+H_Y+cH_XH_Y=V_K$, $c=2.3414574/V_K$, $H_X$ and $H_Y$ are the equivalent write voltage generated by the bit line and write word line currents, respectively; and $V_K$ is the equivalent voltage of the coercive fields.

* * * * *